(12) United States Patent
Chen et al.

(10) Patent No.: US 12,176,065 B2
(45) Date of Patent: Dec. 24, 2024

(54) CHANNEL ROUTING FOR SIMULTANEOUS SWITCHING OUTPUTS

(71) Applicants: ATI Technologies ULC, Markham (CA); Advanced Micro Devices, Inc., Santa Clara, CA (US)

(72) Inventors: Xuan Chen, Richmond Hill (CA); Chih-Hua Hsu, Taipei (TW); Pradeep Jayaraman, San Jose, CA (US); Abdussalam Aburwein, Milpitas, CA (US)

(73) Assignees: ATI Technologies ULC, Markham (CA); Advanced Micro Devices, Inc., Santa Clara, CA (US)

( * ) Notice: Subject to any disclaimer, the term of this patent is extended or adjusted under 35 U.S.C. 154(b) by 175 days.

(21) Appl. No.: 17/849,197

(22) Filed: Jun. 24, 2022

(65) Prior Publication Data
US 2023/0420018 A1 Dec. 28, 2023

(51) Int. Cl.
*G11C 7/22* (2006.01)
*G11C 5/02* (2006.01)
*G11C 7/10* (2006.01)
*G11C 8/18* (2006.01)

(52) U.S. Cl.
CPC .............. *G11C 7/222* (2013.01); *G11C 5/025* (2013.01); *G11C 7/1063* (2013.01); *G11C 7/109* (2013.01); *G11C 8/18* (2013.01)

(58) Field of Classification Search
CPC .................................. G11C 7/222; G11C 7/22
USPC ....................................................... 365/233.1
See application file for complete search history.

(56) References Cited

U.S. PATENT DOCUMENTS

| | | | |
|---|---|---|---|
| 8,028,186 B2* | 9/2011 | Bennett | G06F 13/4243 710/316 |
| 2014/0138851 A1 | 5/2014 | Kin et al. | |
| 2015/0048521 A1* | 2/2015 | Kwon | H01L 25/105 257/777 |
| 2016/0093340 A1 | 3/2016 | Sun et al. | |

(Continued)

OTHER PUBLICATIONS

International Search Report and Written Opinion for International Application No. PCT/US2023/024916 mailed Sep. 29, 2023, 8 pages.

*Primary Examiner* — Muna A Techane
(74) *Attorney, Agent, or Firm* — Polansky & Associates, P.L.L.C.; Paul J. Polansky (57) ABSTRACT

A data processor is for accessing a memory having a first pseudo channel and a second pseudo channel. The data processor includes at least one memory accessing agent, a memory controller, and a data fabric. The at least one memory accessing agent generates generating memory access requests including first memory access requests that access the memory. The memory controller provides memory commands to the memory in response to the first memory access requests. The data fabric routes the first memory access requests to a first downstream port in response to a corresponding first memory request accessing the first pseudo channel, and to a second downstream port in response to the corresponding first memory request accessing the second pseudo channel. The memory controller has first and second upstream ports coupled to the first and second downstream ports of the data fabric, respectively, and a downstream port coupled to the memory.

20 Claims, 9 Drawing Sheets

(56) References Cited

U.S. PATENT DOCUMENTS

2016/0099203 A1    4/2016  Kim
2020/0098730 A1*  3/2020  Keeth .................... H01L 24/02
2021/0240615 A1*  8/2021  Sohn .................. G06F 12/0284

* cited by examiner

CHANNEL ROUTING FOR SIMULTANEOUS SWITCHING OUTPUTS

BACKGROUND

Modern dynamic random-access memory (DRAM) provides high memory bandwidth by increasing the speed of data transmission on the bus connecting the DRAM and one or more data processors, such as graphics processing units (GPUs), central processing units (CPUs), and the like. DRAM is typically inexpensive and high density, thereby enabling large amounts of DRAM to be integrated per device. Most DRAM chips sold today are compatible with various double data rate (DDR) DRAM standards promulgated by the Joint Electron Devices Engineering Council (JEDEC). Typically, several DDR DRAM chips are combined onto a single printed circuit board substrate to form a memory module that can provide not only relatively high speed but also scalability.

One type of DDR DRAM, known as graphics double data rate (GDDR) DRAM, has pushed the boundaries of data transmission rates to accommodate the high data bandwidth needed for graphics applications. A new GDDR standard known as GDDR, version seven (GDDR7) is being developed that supports significantly higher data rates than existing version six (GDDR6) DRAM. For example, instead of conventional binary data transmission used in existing versions of the DDR and the graphics DDR standards, GDDR7 will specify a multi-level data transmission and reception mode in addition to a conventional two-level (NRZ) system. For example, when finalized GDDR7 may include a four-level pulse amplitude modulation (PAM4) scheme that allows the transmission and reception of two binary bits for each clock transition instead of just two. The use of PAM4 signaling doubles the data transmission bandwidth for a given clock speed. With support for four by-eight (×8) channels and PAM4 signaling, GDDR7 may achieve data rates as high as 160 gigabits per second (GB/s). However, transmission at data rates that high makes it very difficult to correctly receive signals because cross-talk and interference caused by the dense package routing used in modern ball-grid-array (BGA) packages.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

An integrated circuit has a double data rate (DDR) memory controller and includes a semiconductor die. The semiconductor die includes a physical interface circuit and a plurality of signal pads. The physical interface circuit is coupled to the DDR memory controller and conducts a plurality of data signals and generates a plurality of command and address signals. The plurality of signal pads is disposed on a surface of the semiconductor die, and the plurality of signal pads includes, in a plan view of the surface, a first subset of data signal pads in an upper left portion, a second subset of data signal pads in an upper right portion, a third subset of command and address signal pads in a lower left portion, and a fourth subset of command and address signal pads in a lower right portion.

An integrated circuit includes a semiconductor die and a plurality of signal pads. The semiconductor die includes a physical interface circuit that generates signals of a first signal group and a second signal group, and a plurality of signal pads disposed on a surface of the semiconductor die. The plurality of signal pads comprises, in a plan view, a first subset of data signal pads conducting a first portion of signals of the first signal group in an upper left portion, a second subset of data signal pads conducting a second portion of signals of the first signal group in an upper right portion, a third subset of command and address signal pads conducting the first portion of signals of the second signal group in a lower left portion, and a fourth subset of command and address signal pads conducting the second portion of signals of the second signal group in a lower right portion.

A method of making an integrated circuit having a DDR memory controller and a first DDR memory physical interface circuit on a semiconductor die. The method includes separating die signal pads disposed on a surface of the semiconductor die into a first group of signal pads conducting data signals and a second group of signal pads conducting command and address signals. A first subset of data signal pads in placed in an upper left portion in a plan view of the surface. A second subset of data signal pads is placed in an upper right portion in the plan view. A third subset of command and address signal pads is placed in a lower left portion in the plan view. A fourth subset of command and address signal pads in a lower right portion in the plan view. Signals of the first subset of data signal pads are routed in a first routing layer of an integrated circuit package in a cross section. Signals of the second subset of data signal pads are routed in a second routing layer of the integrated circuit package in the cross section.

Figure 1:
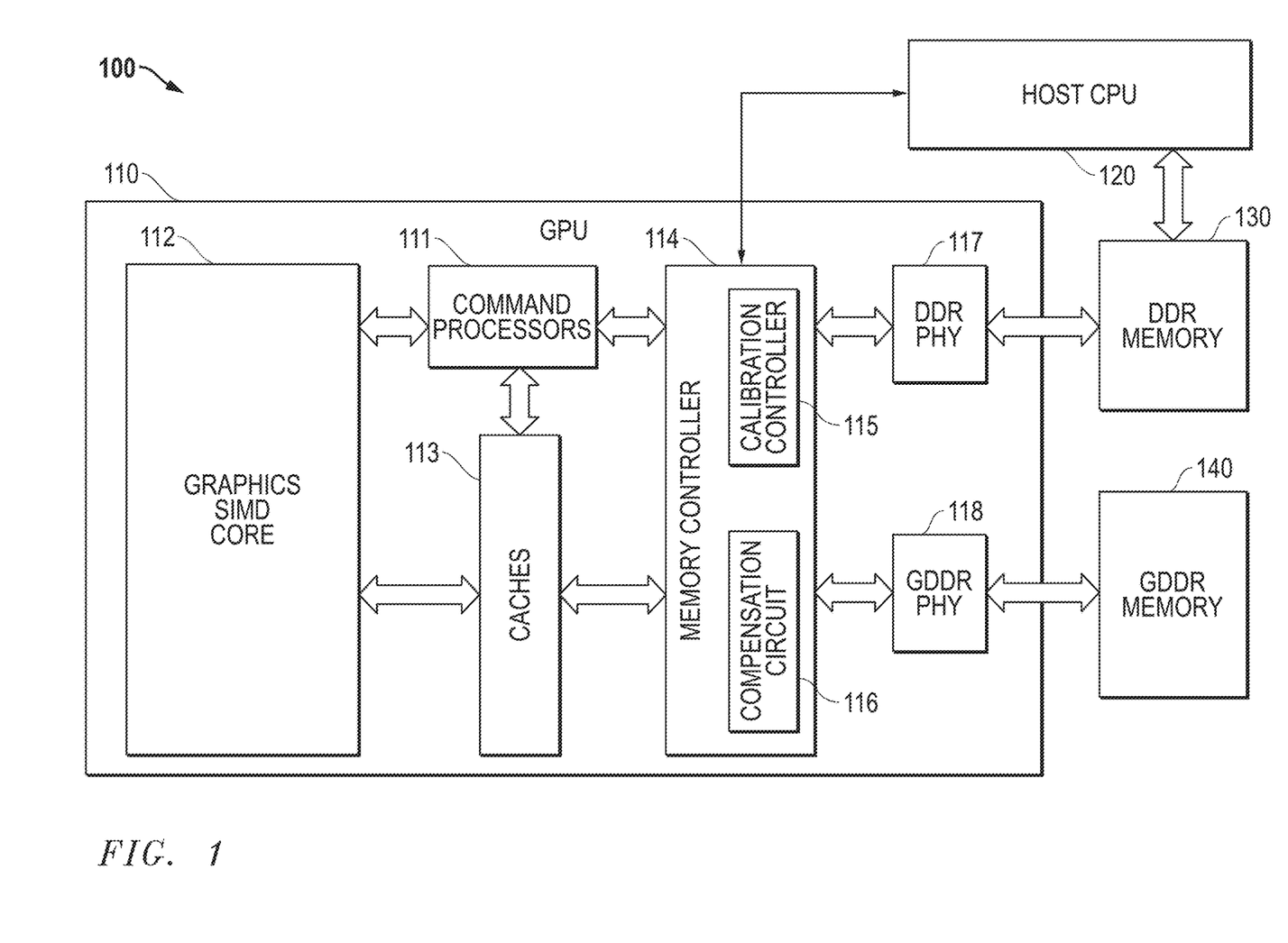
FIG. 1 illustrates in block diagram form a data processing system having simultaneous switched outputs according to some embodiments.

FIG. 1 illustrates in block diagram form a data processing system 100 having simultaneous switched outputs according to some embodiments. Data processing system 100 includes generally a data processor in the form of a graphics processing unit (GPU) 110, a host central processing unit (CPU) 120, a double data rate (DDR) memory 130, and a graphics DDR (GDDR) memory 140.

GPU 110 is a discrete graphics processor that has extremely high performance for optimized graphics processing, rendering, and display, but requires a high memory bandwidth for performing these tasks. GPU 110 includes generally a set of command processors 111, a graphics single instruction, multiple data (SIMD) core 112, a set of caches 113, a memory controller 114, a DDR physical interface circuit (DDR PHY) 117, and a GDDR PHY 118.

Command processors 111 are used to interpret high-level graphics instructions such as those specified in the OpenGL programming language. Command processors 111 have a bidirectional connection to memory controller 114 for receiving high-level graphics instructions such as OpenGL instructions, a bidirectional connection to caches 113, and a bidirectional connection to graphics SIMD core 112. In response to receiving the high-level instructions, command processors issue low-level instructions for rendering, geometric processing, shading, and rasterizing of data, such as frame data, using caches 113 as temporary storage. In response to the graphics instructions, graphics SIMD core 112 performs low-level instructions on a large data set in a massively parallel fashion. Command processors 111 and caches 113 are used for temporary storage of input data and output (e.g., rendered and rasterized) data. Caches 113 also have a bidirectional connection to graphics SIMD core 112, and a bidirectional connection to memory controller 114.

Memory controller 114 has a first upstream port connected to command processors 111, a second upstream port connected to caches 113, a first downstream bidirectional port to DDR PHY 117, and a second downstream bidirectional port to GDDR PHY 118. As used herein, "upstream" ports are on a side of a circuit toward a data processor and away from a memory, and "downstream" ports are in a direction away from the data processor and toward a memory. Memory controller 114 controls the timing and sequencing of data transfers to and from DDR memory 130 and GDDR memory 140. DDR and GDDR memory have asymmetric accesses, that is, accesses to open pages in the memory are faster than accesses to closed pages. Memory controller 114 stores memory access commands and processes them out-of-order for efficiency by, e.g., favoring accesses to open pages, while observing certain quality-of-service objectives.

DDR PHY 117 has an upstream port connected to the first downstream port of memory controller 114, and a downstream port bidirectionally connected to DDR memory 130. DDR PHY 117 meets all specified timing parameters of the version of DDR memory 130, such as DDR version five (DDR5), and performs timing calibration operations at the direction of memory controller 114. Likewise, GDDR PHY 118 has an upstream port connected to the second downstream port of memory controller 114, and a downstream port bidirectionally connected to GDDR memory 140. GDDR PHY 118 meets all specified timing parameters of the version of GDDR memory 140, such as GDDR version seven (GDDR7), and performs timing calibration operations at the direction of memory controller 114.

GPU 110 uses calibration controller 115 to establish initial timing parameters for delay times in capturing read data in GPU 110 and launching write data that can be correctly captured by GDDR memory 140 by finding the centers of the respective "data eyes". GPU 110 uses compensation circuit 116 to compensate for voltage and temperature drift during operation to avoid needing periodic re-calibration during operation.

Known layout patterns have been sufficient to support communications with dual channel GDDR6 DRAM at existing memory clock speeds. However, GDDR7 has doubled the number of signal channels, each having fewer data signals, and has introduced multi-level signaling, e.g. PAM4. The inventors have discovered that because of these changes, the inter-channel interference and cross-talk, as well as intra-channel signal interference and cross-talk for simultaneous switched outputs of the same channel, may cause data eye closure and frequent data errors using these known layout techniques.

Figure 2:
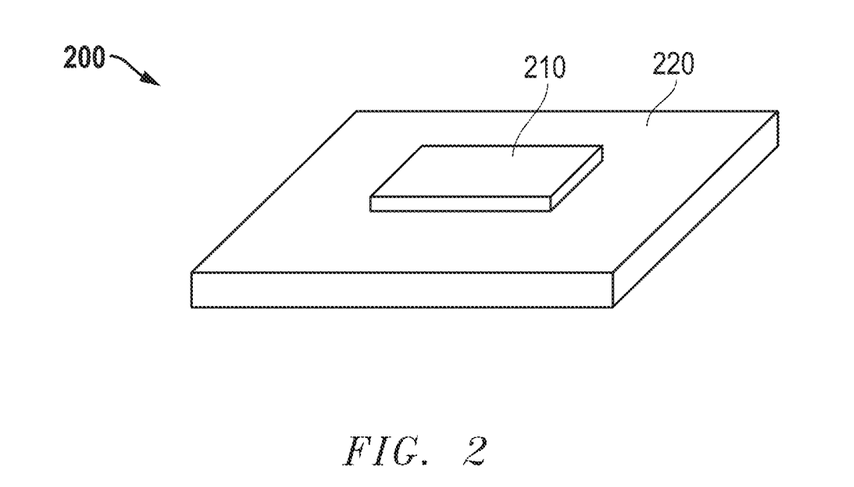
FIG. 2 illustrates in perspective view an integrated circuit GPU suitable for use in the data processing system of FIG. 1 according to some embodiments.

FIG. 2 illustrates in perspective view an integrated circuit GPU 200 suitable for use in data processing system 100 of FIG. 1 according to some embodiments. Integrated circuit GPU 200 includes a GPU die 210 and an integrated circuit package 220. GPU die 210 is a semiconductor integrated circuit chip having a back surface oriented upward in FIG. 2, and a front or active surface facing downward in FIG. 2. GPU die 210 includes a set of die pads that are suitable for bonding to corresponding terminals on integrated circuit package 220. Integrated circuit package 220 includes a top surface for connection to GPU die 210, and a bottom surface having a plurality of solder balls in a ball grid array (BGA) structure. The BGA package uses the larger solder balls to eventually bond to corresponding metallic terminals on a top surface of a printed circuit board (PCB) that contains other components, such as GDDR memory 140 as shown in FIG. 1. Since the GPU die pads are smaller and more compact, they are more susceptible to signal interference from adjacent pads. This interference can lead to significant cross-coupling of signals and potentially to data errors in the simultaneous switched outputs.

Figure 3:
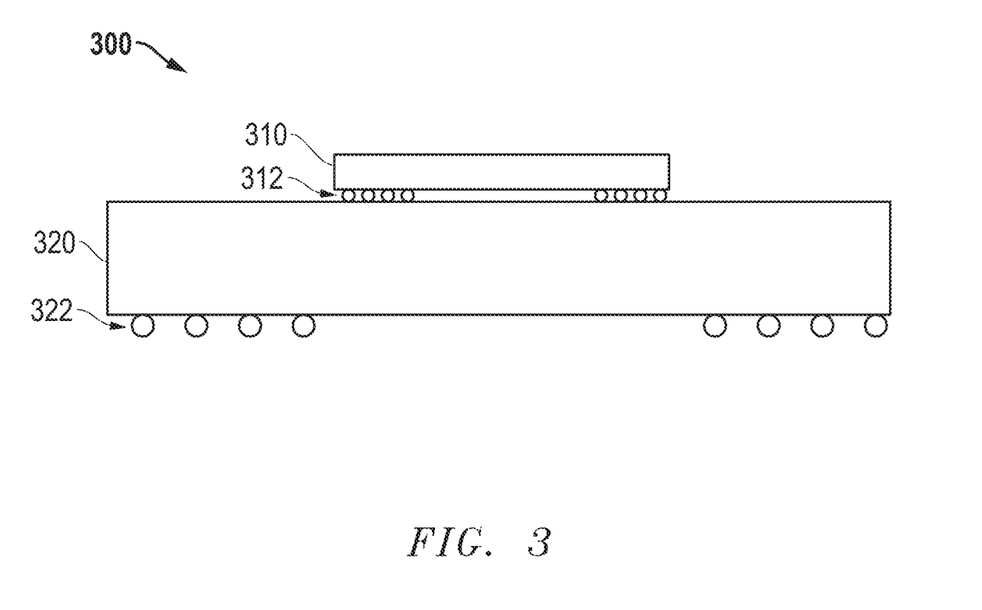
FIG. 3 illustrates a cross section of the integrated circuit GPU of FIG. 2.

FIG. 3 illustrates a cross section 300 of the integrated circuit GPU 200 of FIG. 2. Cross section 300 includes a GPU die 310 and integrated circuit package 320 corresponding to GPU die 210 and integrated circuit package 220 of FIG. 2. GPU die 310 is connected to integrated circuit package 320 through a series of small solder bumps 312 (or by using other suitable inter-metallic bonding techniques), which are not to scale and in various embodiments are significantly smaller than shown in FIG. 2. The small solder bumps 312 bond to and make electrical connection with corresponding die pads and an associated set of solder or other metallic connections (not shown) on the top surface of integrated circuit package 320. Integrated circuit package 320 is a ceramic package having an integral multi-layer signal redistribution structure for relocating and fanning out the die pads to corresponding IC package pads and solder balls having larger dimensions.

As should be apparent from cross section 300, the closest routing of the simultaneous switched outputs of GDDR die 310 occur at or near the die surface into the multi-layer PCB connection, from which the signals eventually fan out.

Figure 4:
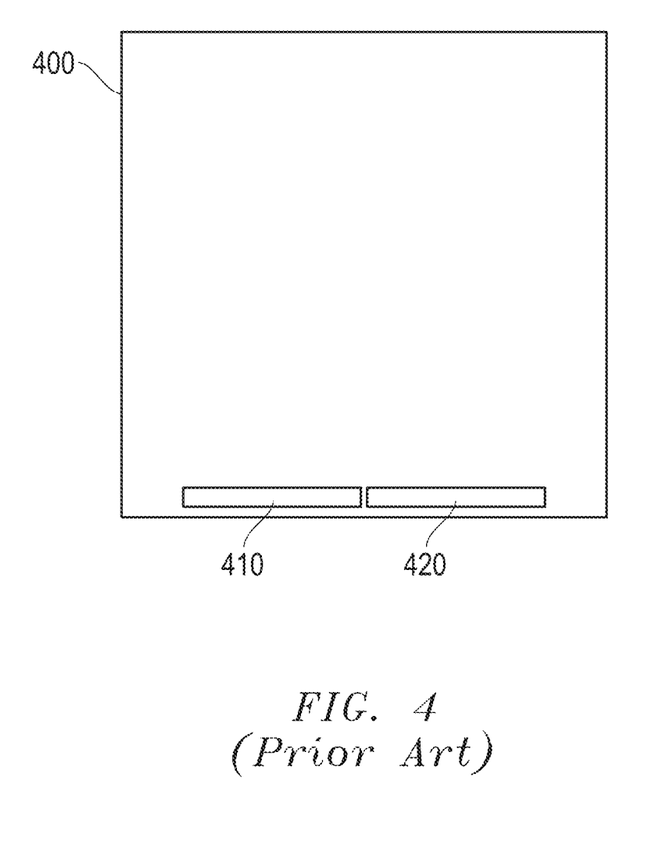
FIG. 4 illustrates in plan view a floor plan of a graphics processing unit (GPU) die having two GDDR memory physical interface circuits known in the prior art.

FIG. 4 illustrates in plan view a floor plan of a graphics processing unit (GPU) die 400 having two GDDR memory physical interface (PHY) circuits known in the prior art. GPU die 400 includes a first PHY circuit area 410 and a second PHY circuit area 420. As shown, the PHYs are contained in a small area compared to the total area of GPU die 400. They are located near the edge of GPU die 400 to allow the signals to be quickly and adequately fanned out through the package PCB layers to multiple package solder balls that will be routed, on the PCB, to adjacent memory die. As known in conventional floor plans, the memory PHY circuits have a very high aspect ratio taking the horizontal direction as the width and the vertical direction as the length as the die is oriented in FIG. 4. This generally horizontal layout helps fan out the signals to the periphery of the package. However, the inventors have discovered that this characteristic creates significant inter-conductor signal interference in the SSOs, potentially creating eye closure in very high-speed memories, such as high-speed GDDR memories and especially in GDDR memories that use multi-level signaling, e.g., PAM-4.

Figure 5:
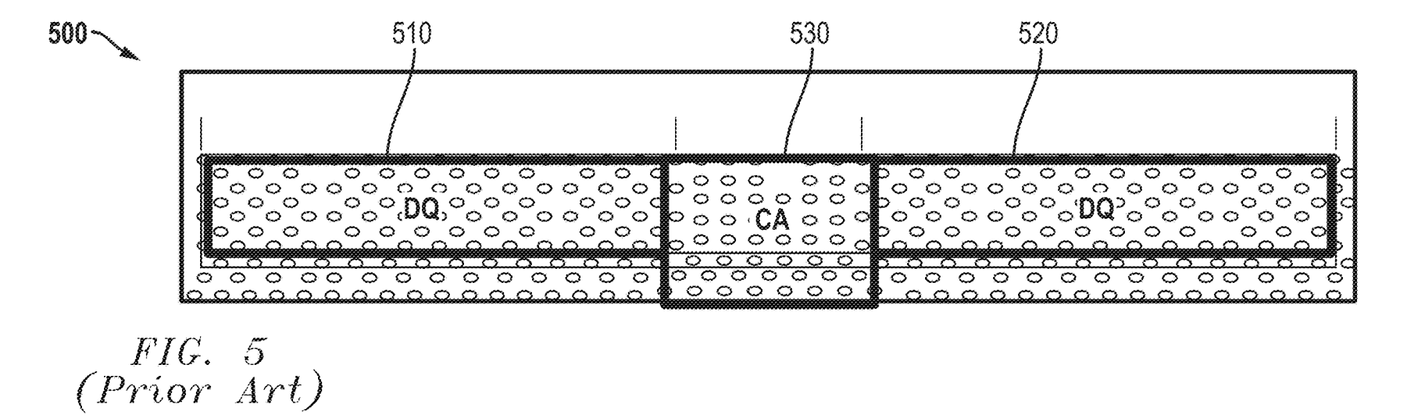
FIG. 5 illustrates in plan view a bottom of an integrated circuit GPU die with a GDDR physical memory interface circuit known in the prior art.

FIG. 5 illustrates in plan view a bottom of an integrated circuit GPU die 500 with a GDDR physical memory interface circuit known in the prior art. The memory PHY includes a first die pad area 510 labelled "DQ" for data input/output signals of a first channel, a second die pad area 520 similarly labelled "DQ" for data input/output signals of a second channel, and a third die pad area 530 labelled "CA" for command, address, and control signals for both data channels. The portion of integrated circuit GPU die 500 shown in FIG. 5 is coextensive with the underlying (as shown in FIG. 5) circuit area for the memory PHY. Each data channel includes 16 data input/output (DQ) signals, 2 data bus inversion control signals, and 2 error detection code (EDC) signals, and two sets of true and complement write clock signals for a total of 24 active signals interspersed with power and ground signals. The CA signals include active signals for each of the two channels, wherein each channel includes 10 command and address (C/A) signals, one set of true and complement command clock signals for a total of 2 signals, 1 clock enable signal, and 1 command bus inversion signal for a total of 14 CA signals for each channel and a total of 28 active signals for both channels interspersed with power and ground signals. The DQ and CA signal routings roughly correspond to the physical layout of a GDDR, version 6 (GDDR6) ball grid array BGA die layout, therefore reducing the number of crossovers and the total number of layers needed for the PCB design. For the illustrated example, the signal routing can be achieved in three layers of a BGA package having one signal layer, one power plane, and one ground place, or in five layers of a BGA package with three signal layers, one power plane, and one ground plane.

Note that the aspect ratio of the PHY layout is high, and in this example is approximately 8.7:1. While this aspect ratio allows many signals to fan out in parallel in the BGA package to distributed balls on the underside of the package, it also creates the opportunity for inter-signal interference and data eye closure for newer and higher-speed GDDR memories, especially those that support multi-level signaling, such as PAM-3 or PAM-4.

Figure 6:
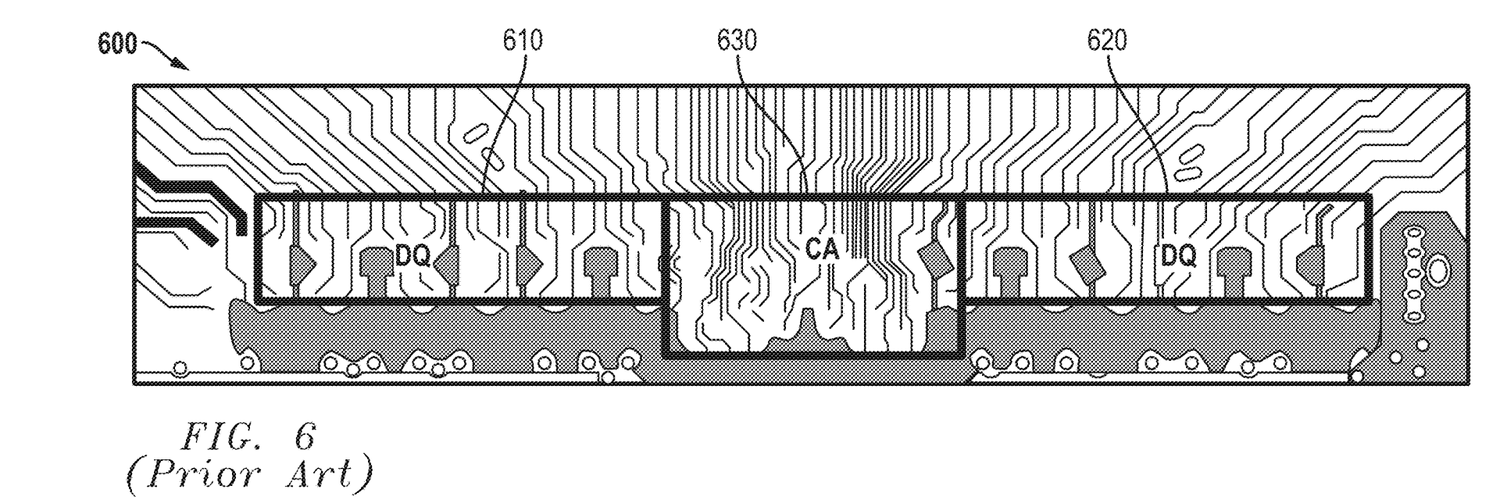
FIG. 6 illustrates in plan view of portion of a single package routing layer of the integrated circuit package of FIG. 5 known in the prior art.

FIG. 6 illustrates in plan view a portion of a single package routing layer 600 of the integrated circuit package of FIG. 5 known in the prior art. Single package routing layer 600 provides a one-layer breakout of the DQ and CA signal groups. Single package routing layer 600 includes a first routing area 610 labelled "DQ" for the data input/output signals of the first channel, a second routing area 620 similarly labelled "DQ" for data input/output signals of the second channel, and a third routing area 630 labelled "CA" for command, address, and control signals for both data channels. As can be seen, single package routing layer 600 has many parallel signal lines in which the signal traces are routed close together. While the inter-signal interference was acceptable for single level ("NRZ") signaling in GDDR6 memory at command clock frequencies of around 1.5 giga-Hertz (GHz) and data clock frequencies of around 3.0 GHz, when the overall data bandwidth increases, such as by implementing PAM-3 or PAM-4 signaling at existing GDDR6 clock frequencies, increasing the command and data clock frequencies, or both, the inter-signal interference may cause data eye closure or frequent data errors.

Figure 7:
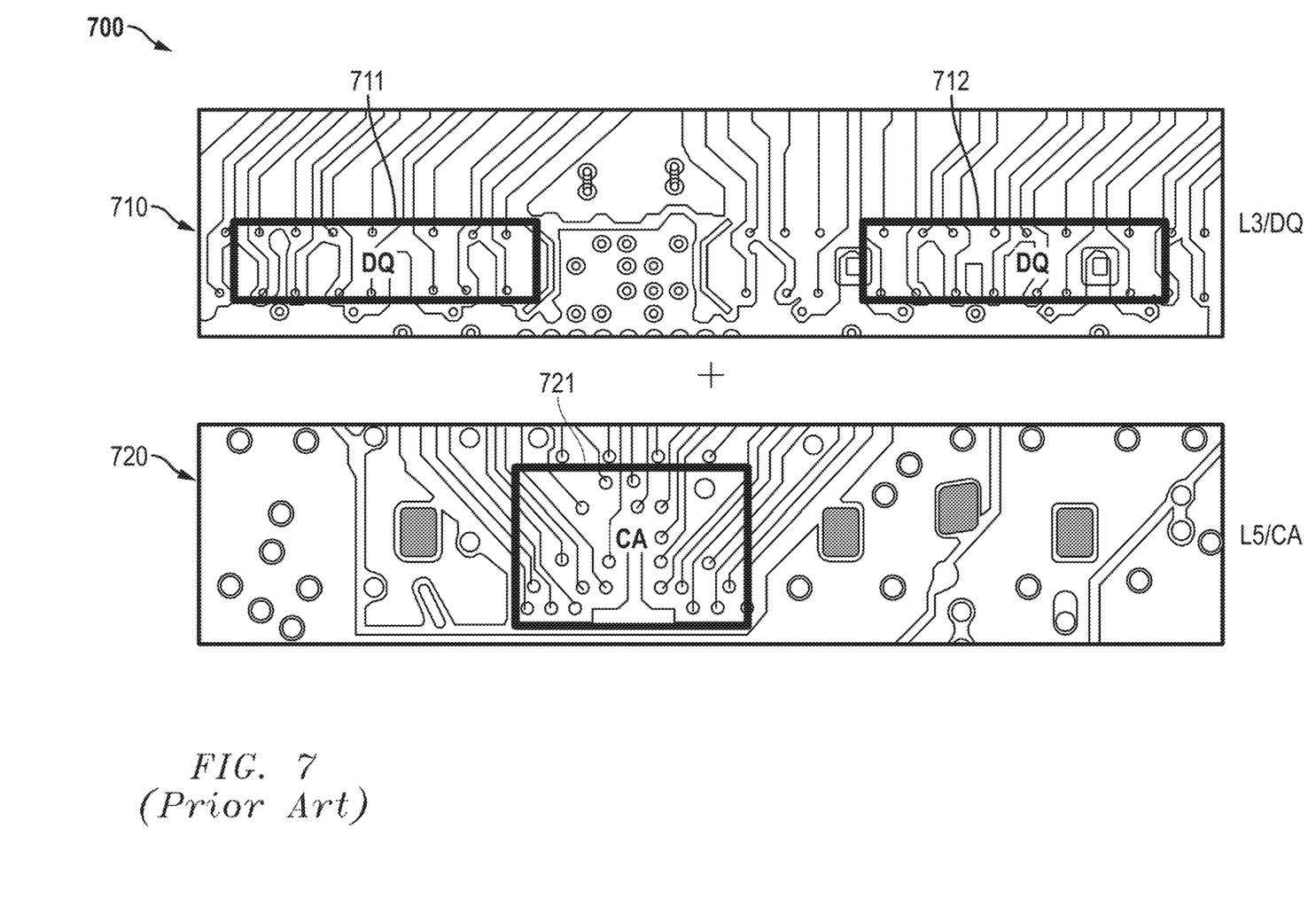
FIG. 7 illustrates in plan view of two package routing layers of the integrated circuit package of FIG. 5 according to some embodiments.

FIG. 7 illustrates in plan view two package routing layers 700 of the integrated circuit package of FIG. 5 known in the prior art. Package routing layers 700 include a first package routing layer 710 at the third or L3 layer labelled "L3/DQ", and a second package routing layer 720 at a fifth or L5 layer labelled "L5/CA". First package routing layer 710 includes a first DQ signal area 711 for the DQ group pins of a first channel, and a second DQ signal area 712 for the DQ group pins of a second channel. Second package routing layer 720 includes a CA signal area 721 for the CA group pins of the first and second channels. As can be seen visually from package routing layers 710 and 720, adjacent signal pins continue to have close routing as the signals from dense signal groupings breakout, especially CA signals, to adjacent points. While these breakouts may have been acceptable for GDDR6 DRAMs, the inventors have discovered that they will be insufficient as clock speeds and data transfer rates double for GDDR7 DRAMs.

Figure 8:
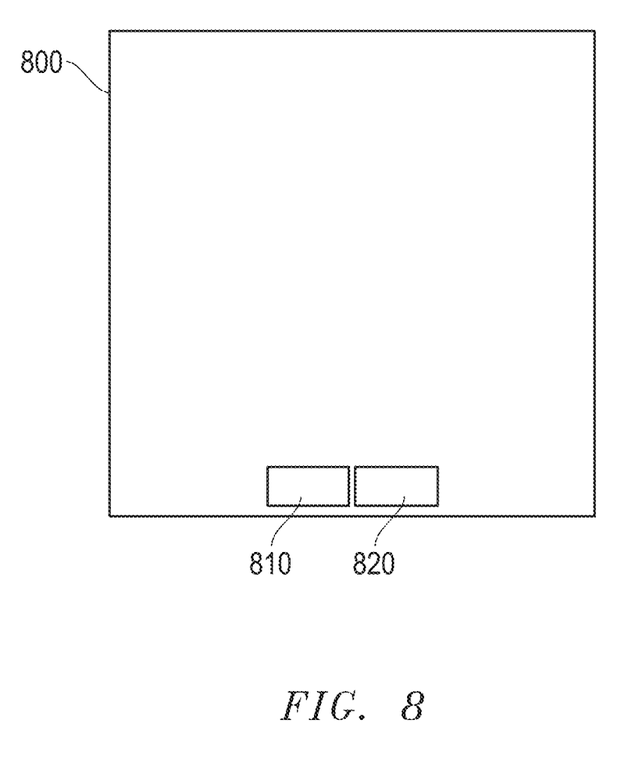
FIG. 8 illustrates in plan view a floor plan of a GPU die having two GDDR physical memory interface circuits according to some embodiments.

FIG. 8 illustrates in plan view a floor plan of a GPU die 800 having two GDDR physical memory interface circuits according to some embodiments. GPU die 800 includes a first PHY circuit area 810 and a second PHY circuit area 820. As shown, the PHYs are contained in a small area compared to the total area of GPU die 800 and occupy about the same proportion of the total area of die floor plan 800 as did the PHYs on the die floor plan of GPU die 400 of FIG. 4. Each of PHY circuit areas 810 and 820 have two channels of the four-channel ×8 GDDR7 architecture along with a common CA area. While they are still located near the edge of the GPU die 800 to allow the signals to be quickly and adequately fanned out through the package PCB layers to multiple package solder balls that will be routed, on the PCB, to adjacent memory die, their aspect ratios are significantly reduced compared to the aspect ratios of PHY circuit area 410 and PHY circuit area 420 of FIG. 4. In particular, the aspect ratio of each of PHY circuit areas 810 and 820 is approximately equal to 2.35:1. This lower aspect ratio in addition to a new layer routing significantly reduces inter-conductor signal interference in the SSOs, allowing them to operate at the high speeds and multi-level signaling, e.g., PAM-4, proposed for GDDR7.

Figure 9:
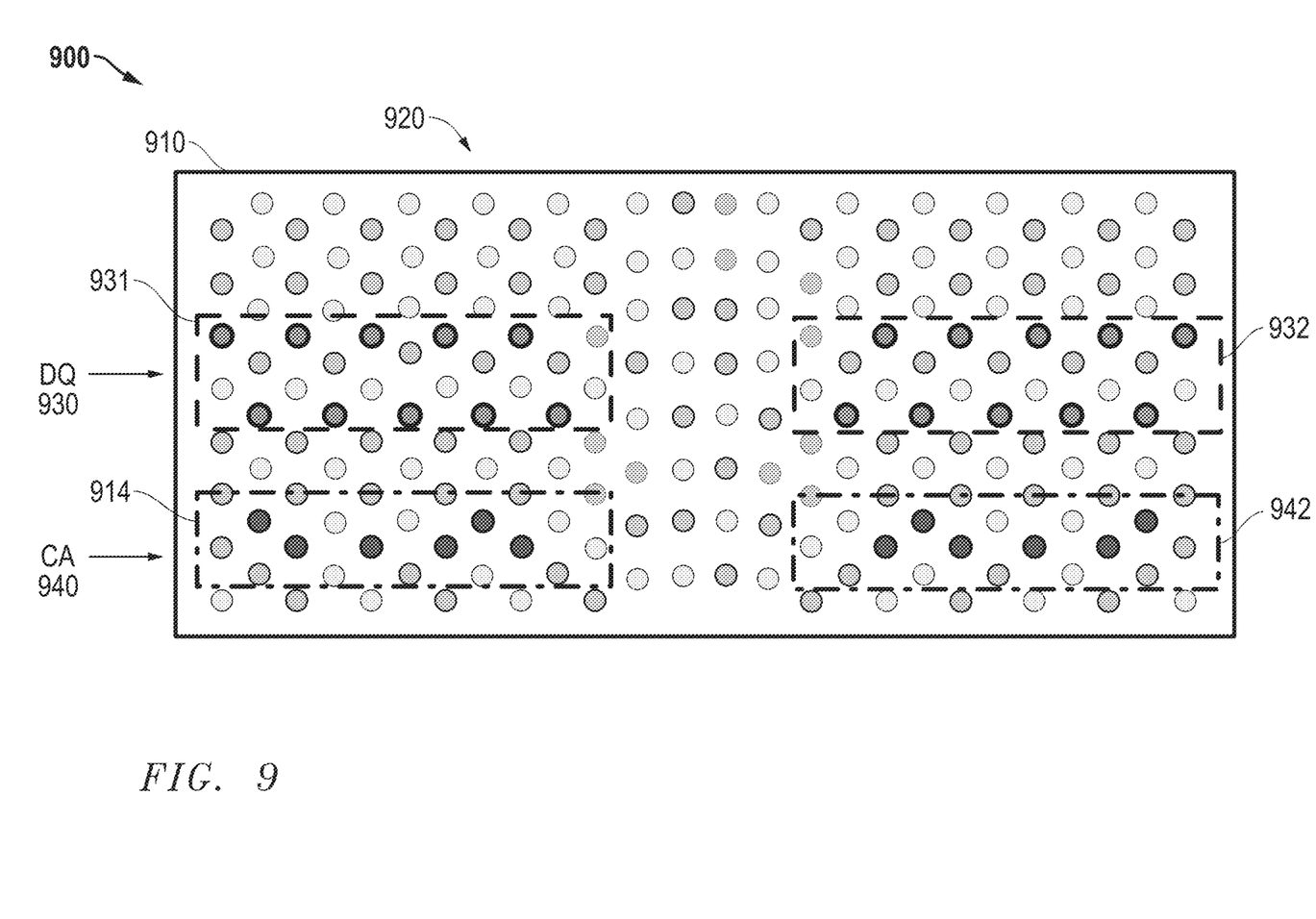
FIG. 9 illustrates in plan view a floor plan of the die pads of the GPU die of FIG. 8 according to some embodiments.

FIG. 9 illustrates in plan view a floor plan 900 of die pads of the GPU die 800 of FIG. 8 according to some embodiments. Floor plan 900 includes a GDDR memory PHY area 910 including an array of signal pads 920. Array of signal pads 920 includes sets of DQ pads 930 and sets of CA pads 940 arranged as a first subset of DQ signal pads 931 in an upper left portion of floor plan 900 as floor plan 900 is oriented in FIG. 9, a second subset of DQ pads 932 in an upper right portion, a third subset of CA signal pads 941 in a lower left portion, and a fourth subset of CA signal pads 942 in a lower right portion. Each also includes interspersed power and ground signal pads. By re-arranging the underlying circuit blocks, the inventors have been able to lower the aspect ratio of the GDDR PHY and make use of greater signal separation to reduce inter-signal interference during signal breakout in the package routing layers.

Figure 10:
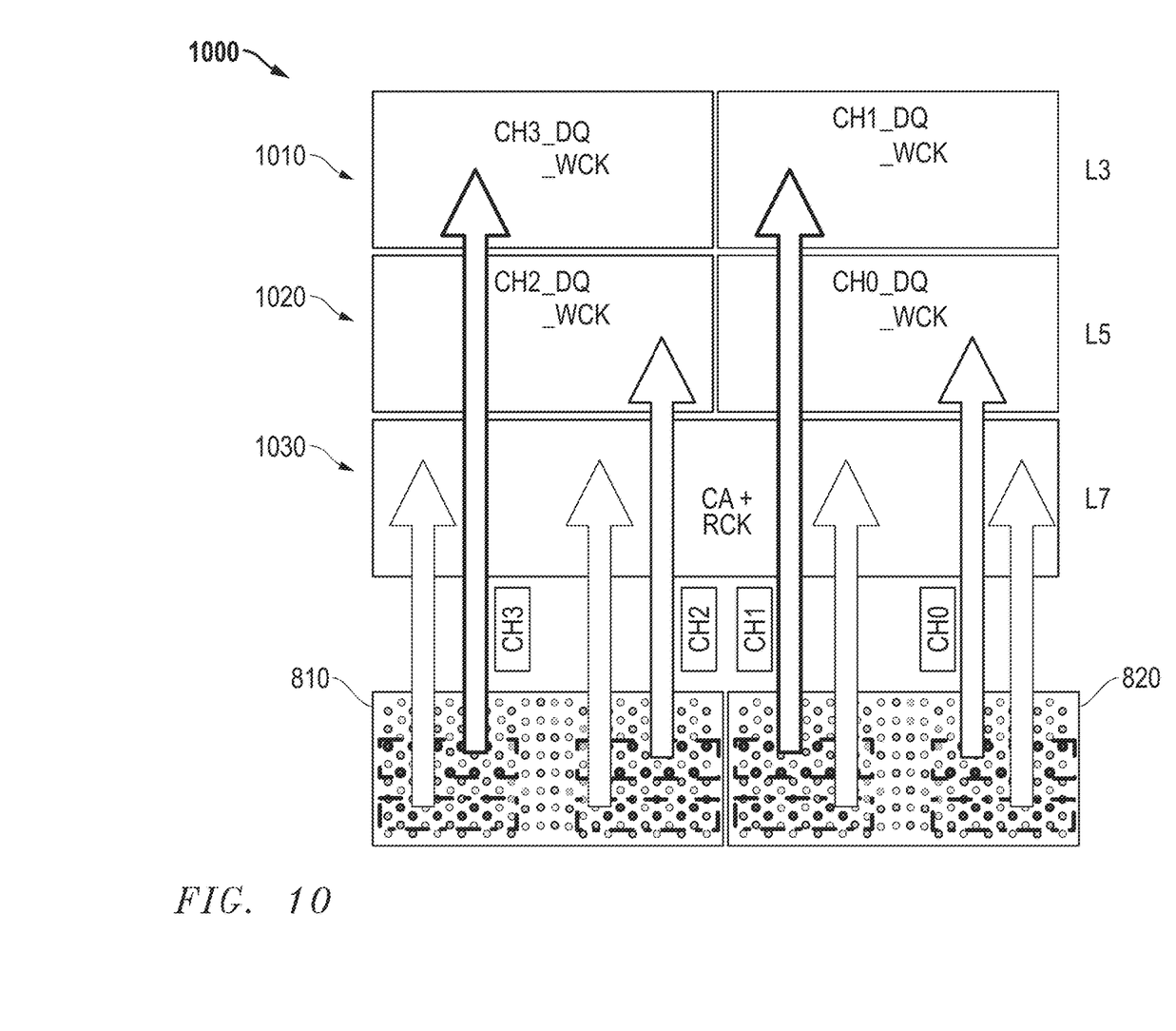
FIG. 10 illustrates in partial plan view and partial cross section a diagram showing the distribution of the die pads of the GPU die of FIG. 9 to package layers according to some embodiments.

FIG. 10 illustrates in partial plan view and partial cross section a diagram of an integrated circuit package 1000 showing the distribution of the die pads of the GPU die of FIG. 9 to package layers according to some embodiments. Integrated circuit package 1000 shows two PHYs corresponding to PHY circuit areas 810 and 820 of FIG. 8, an L3 layer 1010, an L5 layer 1020, and an L7 layer 1030. Integrated circuit package 1000 shows the DQ signals along with WCK signals for channel 0 are routed from the die surface layer to L5 layer 1020, whereas the DQ and WCK signals for a channel 1 are routed from the die surface layer to L3 layer 1010, in which the L3 and L5 layers are separated by a power plane or a ground plane. Similarly, the DQ signals along with WCK signals for a channel 2 are routed from the die surface layer to L5 layer 1020, whereas the DQ signals along with respective WCK signals for a channel 3 are routed from the die surface layer to L3 layer 1010. The CA and RCK signals for channels 0-3 are routed from the die surface layer to an L7 layer 1030, in which the CA and RCK signals for channel 0 are horizontally separated from the CA signals for channel 1 by the DQ and WCK signals for channel 0, the CA signals for channel 1 are horizontally separated from the CA and RCK signals for channel 2 by the DQ and WCK signals for channel 1 and the DQ and WCK signals for channel 2, and the CA and RCK signals for channel 2 are horizontally separated from the CA signals for channel 3 by the DQ and WCK signals for channel 3. The L5 and L7 layers are separated by a power plane or a ground plane. Note that PHY circuit areas 810 and 820 have the same layout but are oriented in mirror image form along a vertical line of symmetry between them.

Figure 11:
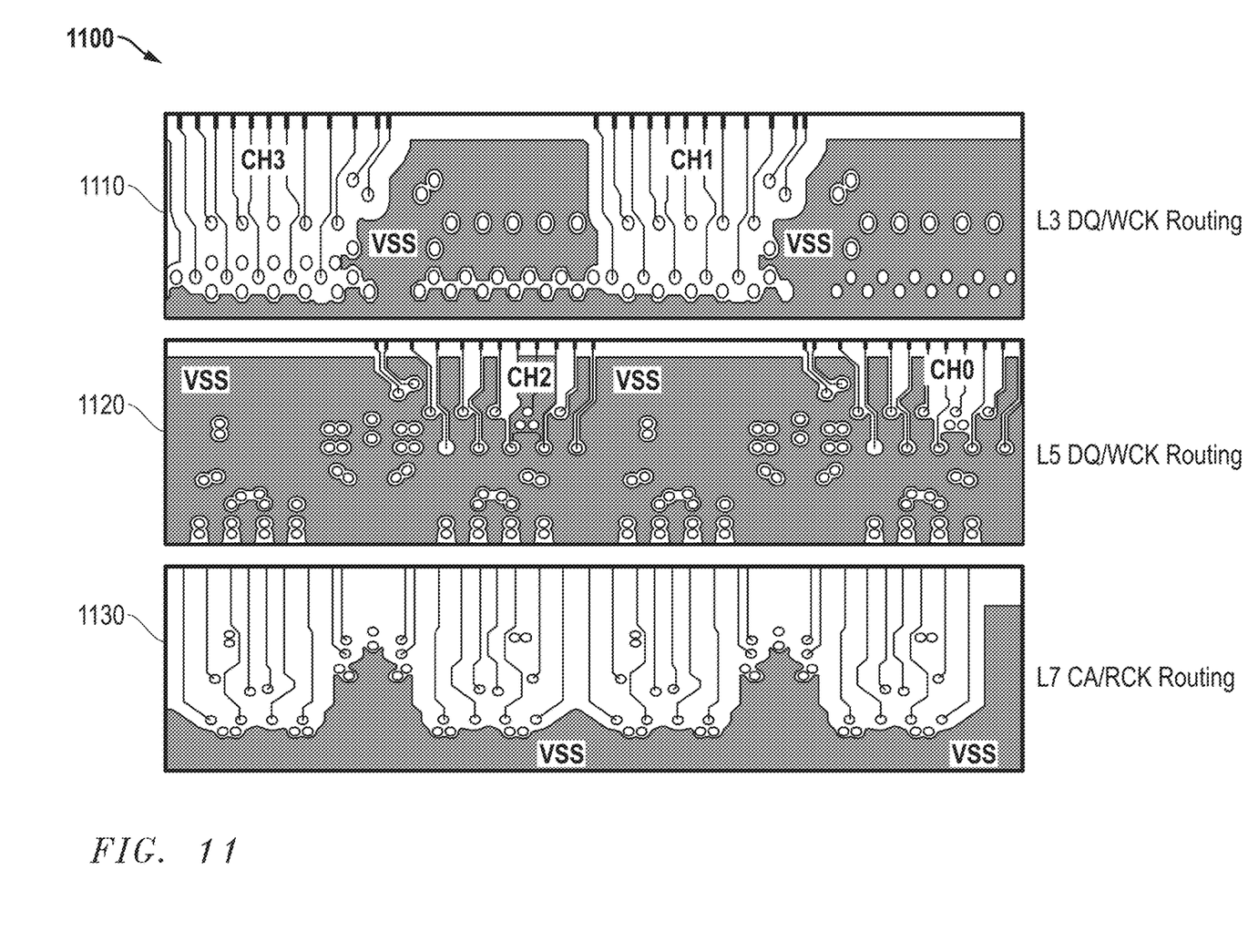
FIG. 11 illustrates a set of plan view diagrams showing the die pad-to-package layer correspondence of the GPU die of FIGS. 8-10 according to some embodiments.

FIG. 11 illustrates a set 1100 of plan view diagrams showing the die pad-to-package layer correspondence of the GPU die of FIGS. 8-10 according to some embodiments. Set 1100 includes an L3 layer 1110 routing DQ and WCK signals for channels 1 and 3, an L5 layer 1120 routing DQ and WCK signals for channels 0 and 2, and an L7 layer routing CA and RCK signals both channels. As indicated before, L3 layer 1010 and L5 layer 1020 are separated by an L4 layer (not shown) having a power or ground plane, and L5 layer 1020 and L7 layer 1030 are separated by an L6 layer (not shown) having a power or ground plane. Set 1100 shows that by staggering the channels on separate package layers, each channel's DQ signals are separated laterally from each other by significant VSS areas, providing good channel-to-channel isolation. In addition, by routing the DQ and CA signals using three package layers, the spacing between signals within each signal group can be increased.

A PHY circuit, GPU, SOC, or portions thereof described herein can be embodied one or more integrated circuits, any of which may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, the particular package routing layers used can be varied in different embodiments. Moreover, while the techniques described herein were illustrated in the context of a GDDR7 DRAM, it should be apparent that corresponding techniques could be applied to other or future GDDR or DDR DRAMs or other types of integrated circuits with high-speed signal transmission and/or multi-level signaling to improve signal integrity.

Accordingly, it is intended by the appended claims to cover all modifications of the disclosed embodiments that fall within the scope of the disclosed embodiments.

What is claimed is:

1. An integrated circuit having a DDR memory controller, comprising:
   a semiconductor die comprising:
   a physical interface circuit coupled to the DDR memory controller that conducts a plurality of data signals and generates a plurality of command and address signals and having a physical interface circuit area on a surface of said semiconductor die;
   a plurality of signal pads disposed on said surface of said semiconductor die within said physical interface circuit area, wherein said plurality of signal pads comprise, in a plan view of said surface:
   a first subset of data signal pads in an upper left portion;
   a second subset of data signal pads in an upper right portion;
   a third subset of command and address signal pads in a lower left portion; and
   a fourth subset of command and address signal pads in a lower right portion.

2. The integrated circuit of claim 1, wherein said physical interface circuit conducts said plurality of data signals using more than two signal levels.

3. The integrated circuit of claim 2, wherein said physical interface circuit conducts said plurality of data signals using four-level pulse amplitude modulation (PAM4) signaling.

4. The integrated circuit of claim 1, further comprising:
   an integrated circuit package comprising a first routing layer and a second routing layer, wherein:
   said first routing layer conducts signals of said first subset of data signal pads; and
   said second routing layer conducts signals of said second subset of data signal pads.

5. The integrated circuit of claim 4, wherein said integrated circuit package further comprises:
   a third routing layer that conducts command and address signals from said third subset of command and address signal pads and said fourth subset of command and address signal pads.

6. The integrated circuit of claim 1, wherein each of said first subset of data signal pads and said second subset of data signal pads further conduct respective data clock signals.

7. The integrated circuit of claim 1, wherein said physical interface circuit is a graphics double data rate, version seven (GDDR7) DRAM physical interface circuit.

8. The integrated circuit of claim 7, wherein said semiconductor die further comprises:

a graphics processing unit for generating memory access requests, wherein the DDR memory controller is operative to reorder said memory access requests from said graphics processing unit and send reordered memory access requests to said physical interface circuit.

9. An integrated circuit, comprising:
a semiconductor die comprising:
a physical interface circuit that generates signals of a first signal group and a second signal group and having a physical interface circuit area on a surface of said semiconductor die;
a plurality of signal pads disposed on said surface of the semiconductor die within said physical interface circuit area, wherein said plurality of signal pads comprises, in a plan view:
a first subset of data signal pads conducting a first portion of signals of said first signal group in an upper left portion;
a second subset of data signal pads conducting a second portion of signals of said first signal group in an upper right portion;
a third subset of command and address signal pads conducting said first portion of signals of said second signal group in a lower left portion; and
a fourth subset of command and address signal pads conducting said second portion of signals of said second signal group in a lower right portion.

10. The integrated circuit of claim 9, further comprising:
an integrated circuit package comprising a first routing layer and a second routing layer, wherein:
said first routing layer conducts signals from said first subset of data signal pads; and
said second routing layer conducts said signals from said second subset of data signal pads.

11. The integrated circuit of claim 10, wherein said integrated circuit package further comprises:
a third routing layer that conducts signals from said third subset of command and address signal pads and said fourth subset of command and address signal pads.

12. The integrated circuit of claim 9, wherein said physical interface circuit comprises a double data rate (DDR) dynamic random access memory (DRAM) physical interface circuit.

13. The integrated circuit of claim 12, wherein said physical interface circuit further comprises a graphics DDR (GDDR) DRAM physical interface circuit.

14. The integrated circuit of claim 13, wherein said physical interface circuit further comprises a GDDR, version seven (GDDR7) DRAM physical interface circuit.

15. The integrated circuit of claim 12, wherein said signals of said first signal group comprise data signals and data clock signals.

16. The integrated circuit of claim 15, wherein said signals of said second signal group comprise command and address signals.

17. A method of making an integrated circuit having a DDR memory controller and a first DDR memory physical interface circuit having a physical interface circuit area on a surface of a semiconductor die, comprising:
separating die signal pads disposed on the surface of the semiconductor die into a first group of signal pads conducting data signals and a second group of signal pads conducting command and address signals;
placing a first subset of data signal pads in an upper left portion of the physical interface circuit area in a plan view of said surface;
placing a second subset of data signal pads in an upper right portion of the physical interface circuit area in said plan view;
placing a third subset of command and address signal pads in a lower left portion of the physical interface circuit area in said plan view;
placing a fourth subset of command and address signal pads in a lower right portion of the physical interface circuit area in said plan view;
routing signals of said first subset of data signal pads in a first routing layer of an integrated circuit package in a cross section; and
routing signals of said second subset of data signal pads in a second routing layer of said integrated circuit package in said cross section.

18. The method of claim 17, further comprising:
routing signals of said third subset of command and address signal pads in a third routing layer of said integrated circuit package in said cross section; and
routing signals of said fourth subset of command and address signal pads in said third routing layer of said integrated circuit package in said cross section.

19. The method of claim 18, wherein said integrated circuit further comprises a second DDR memory physical interface circuit on the semiconductor die, further comprising:
separating second die signal pads disposed on said surface of the semiconductor die into a third group of signal pads conducting second data signals and a fourth group of signal pads conducting second command and address signals;
placing a fifth subset of data signal pads in a second upper left portion in said plan view;
placing a sixth subset of data signal pads in a second upper right portion in said plan view;
placing a seventh subset of command and address signal pads in a second lower left portion in said plan view;
placing an eighth subset of command and address signal pads in a second lower right portion in said plan view;
routing signals of said fifth subset of data signal pads in said first routing layer of said integrated circuit package in said cross section; and
routing signals of said sixth subset of data signal pads in said second routing layer of said integrated circuit package in said cross section,
routing signals of said seventh subset of command and address signal pads in said third routing layer of said integrated circuit package in said cross section; and
routing signals of said eighth subset of command and address signal pads in said third routing layer of said integrated circuit package in said cross section.

20. The method of claim 19, further comprising:
placing said first DDR memory physical interface circuit and said second DDR memory physical interface circuit substantially adjacent to one on the semiconductor die another in said plan view.

* * * * *